(12) United States Patent
Dini et al.

(10) Patent No.: US 8,879,596 B2
(45) Date of Patent: Nov. 4, 2014

(54) SEMICONDUCTOR LASER

(75) Inventors: Dimitri Dini, München (DE); Marc Schillgalies, Berlin (DE)

(73) Assignee: OSRAM Opto Semiconductors GmbH (DE)

( * ) Notice: Subject to any disclaimer, the term of this patent is extended or adjusted under 35 U.S.C. 154(b) by 89 days.

(21) Appl. No.: 13/515,024

(22) PCT Filed: Nov. 12, 2010

(86) PCT No.: PCT/EP2010/067402
§ 371 (c)(1),
(2), (4) Date: Jul. 19, 2012

(87) PCT Pub. No.: WO2011/072964
PCT Pub. Date: Jun. 23, 2011

(65) Prior Publication Data
US 2012/0287956 A1    Nov. 15, 2012

(30) Foreign Application Priority Data
Dec. 15, 2009  (DE) .................. 10 2009 058 345

(51) Int. Cl.
| H01S 5/02 | (2006.01) |
| H01L 21/78 | (2006.01) |
| H01S 5/323 | (2006.01) |
| H01S 5/022 | (2006.01) |
| H01S 5/042 | (2006.01) |
| H01S 5/22 | (2006.01) |

(52) U.S. Cl.
CPC ......... *H01S 5/32341* (2013.01); *H01S 5/02272* (2013.01); *H01S 2304/12* (2013.01); *H01S 5/0425* (2013.01); *H01S 5/2201* (2013.01); *H01S 5/0201* (2013.01)

USPC ........................................ 372/44.01; 438/460

(58) Field of Classification Search
USPC ................. 372/44.01; 438/460; 257/E21.599
See application file for complete search history.

(56) References Cited

U.S. PATENT DOCUMENTS

| 6,812,496 B2 | 11/2004 | Takatani et al. |
| 7,023,891 B2 | 4/2006 | Haneda et al. |
| 2004/0041156 A1 | 3/2004 | Tsuda et al. |
| 2005/0042787 A1 | 2/2005 | Ito et al. |

(Continued)

FOREIGN PATENT DOCUMENTS

| CN | 1519998 A | 8/2004 |
| CN | 101529674 A | 9/2009 |

(Continued)

OTHER PUBLICATIONS

Takeharu Asano et al., "Over 100-mW blue-violet laser diodes for Blu-ray Disc system," Novel in-Plane Semiconductor Lasers III, Proceedings of SPIE, vol. 5365 (SPIE, Bellingham, WA, 2004).

(Continued)

*Primary Examiner* — Armando Rodriguez
(74) *Attorney, Agent, or Firm* — DLA Piper LLP (US)

(57) ABSTRACT

A semiconductor laser includes a semiconductor body having an active region that generates radiation and a ridge-shaped region, wherein the ridge-shaped region has a longitudinal axis running along an emission direction, a central axis of the semiconductor body runs in the emission direction and the longitudinal axis is arranged in a manner offset with respect to the central axis in a transverse direction.

11 Claims, 3 Drawing Sheets

(56) References Cited

U.S. PATENT DOCUMENTS

| | | |
|---|---|---|
| 2006/0192209 A1 | 8/2006 | Maeda et al. |
| 2008/0073664 A1 | 3/2008 | Hata et al. |
| 2008/0130698 A1 | 6/2008 | Bessho et al. |
| 2008/0272462 A1 | 11/2008 | Shimamoto et al. |
| 2010/0085996 A1 | 4/2010 | Matsuno |
| 2011/0281382 A1* | 11/2011 | Bessho et al. .................. 438/31 |

FOREIGN PATENT DOCUMENTS

| | | |
|---|---|---|
| DE | 103 20 376 A1 | 11/2003 |
| EP | 0 874 405 A2 | 10/1998 |
| EP | 0 936 706 A1 | 8/1999 |
| JP | 6-79172 | 11/1994 |
| JP | 2004-95859 | 3/2004 |
| JP | 2007-173402 | 7/2007 |
| JP | 2009200341 | 3/2009 |
| JP | 2009-88270 | 4/2009 |
| JP | 2009-200478 | 9/2009 |
| WO | 2008/047751 A1 | 4/2008 |

OTHER PUBLICATIONS

Japanese Examination Report dated Feb. 12, 2014 for corresponding Japanese Application No. 2012-543557.

* cited by examiner

SEMICONDUCTOR LASER

RELATED APPLICATIONS

This is a §371 of International Application No. PCT/EP2010/067402, with an international filing date of Nov. 12, 2010 (WO 2011/072964 A1, published Jun. 23, 2011), which is based on German Patent Application No. 10 2009 058 345.9, filed Dec. 15, 2009, the subject matter of which is incorporated by reference.

TECHNICAL FIELD

This disclosure relates to a semiconductor laser and to a method for producing a semiconductor laser.

BACKGROUND

During the production of semiconductor lasers on the basis of nitride compound semiconductors, in particular the high-quality growth substrates required for a high crystal quality also constitute a considerable cost factor.

It could therefore be helpful to provide a semiconductor laser of high quality and at the same time can be produced cost-effectively. Furthermore, it could be helpful to provide a method for producing such a semiconductor laser.

SUMMARY

We provide a semiconductor laser including a semiconductor body having an active region that generates radiation and a ridge-shaped region, wherein the ridge-shaped region has a longitudinal axis running along an emission direction, a central axis of the semiconductor body runs in the emission direction and the longitudinal axis is arranged in a manner offset with respect to the central axis in a transverse direction.

We also provide a method for producing a plurality of semiconductor bodies including a) providing a carrier having a multiplicity of component regions separated from one another by separating lines, b) depositing a semiconductor layer sequence having an active region that generates radiation, c) forming a plurality of ridge-shaped regions from the semiconductor layer sequence such that a first ridge-shaped region and a second ridge-shaped region are formed alongside one another between two adjacent separating lines in a direction running perpendicular to the separating lines, wherein at least one of the ridge-shaped regions is arranged closer to a central line running between the adjacent separating lines than to the separating line situated closest to said ridge-shaped region, and d) singulating the semiconductor layer sequence into a plurality of semiconductor bodies each having at least one ridge-shaped region.

We further provide a method for producing a plurality of semiconductor bodies including a) providing a carrier having a multiplicity of component regions separated from one another by separating lines, wherein the separating lines run along regions of the carrier in which the dislocation density is increased compared with regions running between the separating lines: b) depositing a semiconductor layer sequence having an active region that generates radiation, c) forming a plurality of ridge-shaped regions from the semiconductor layer sequence such that a first ridge-shaped region and a second ridge-shaped region are formed alongside one another between two adjacent separating lines in a direction running perpendicular to the separating lines, wherein at least one of the ridge-shaped regions is arranged closer to a central line running between the adjacent separating lines than to the separating line situated closest to said ridge-shaped region; and d) singulating the semiconductor layer sequence along the separating lines and along the central line into a plurality of semiconductor bodies each having at least one ridge-shaped region.

DETAILED DESCRIPTION

Figure 1A:
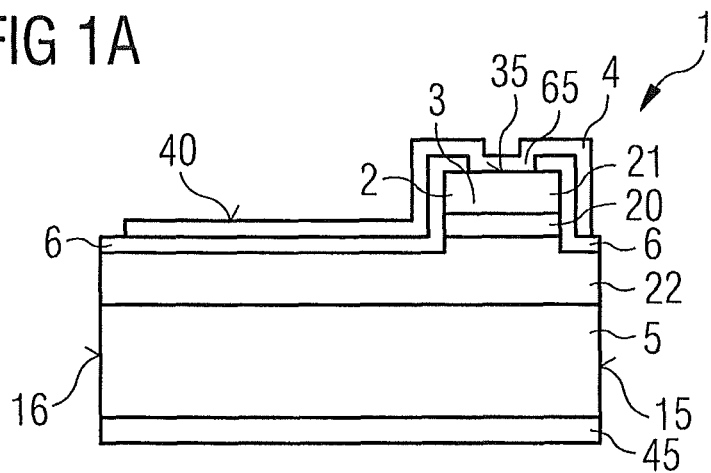
FIGS. 1A and 1B show an example of a semiconductor laser in schematic plan view (FIG. 1B) and associated sectional view (FIG. 1A).

The semiconductor laser may comprise a semiconductor body having an active region that generates radiation and a ridge-shaped region. The ridge-shaped region has a longitudinal axis running along an emission direction, wherein the longitudinal axis is arranged in a manner offset with respect to a central axis—running in the emission direction—of the semiconductor body in a transverse direction.

In this case, a transverse direction is understood to be a direction which runs in the plane of the semiconductor layers of the semiconductor body perpendicularly to the emission direction.

In case of doubt, a central axis is understood to be an axis which runs centrally with respect to two side areas respectively delimiting the semiconductor body in a transverse direction, that is to say equidistantly with respect to the side areas.

In other words, therefore, the ridge-shaped region, in a transverse direction, is at a greater distance from one of the side areas than from the other side area.

In case of doubt, the longitudinal axis of the ridge-shaped region is understood to be an axis which runs through the centroid of the ridge-shaped region in the emission direction.

The central axis of the semiconductor body and the longitudinal axis of the ridge-shaped region preferably run parallel or at least substantially parallel to one another, but are not congruent on account of the offset in a transverse direction.

An arrangement having an offset is in this case understood to be a targeted spacing-apart of the longitudinal axis from the central axis.

In contrast thereto, a distance between the longitudinal axis and the central axis that is caused merely by manufacturing tolerances, for example, on account of alignment inaccuracies during photolithographic patterning, is not understood as an offset.

The ridge-shaped region may be formed in the semiconductor body. Consequently, the ridge-shaped region can serve for wave guiding within the semiconductor body. The active region is furthermore preferably arranged at least partially within the ridge-shaped region. In this case, the side areas of the ridge-shaped region delimit the active region in a transverse direction. In a departure therefrom, however, the active region can also be spaced apart from the ridge-shaped region in a vertical direction, that is to say in a direction running perpendicular to the main extension plane of the semiconductor layer sequence of the semiconductor body.

Alternatively, the ridge-shaped region may be formed on the, in particular prefabricated, semiconductor body. By way of example, the ridge-shaped region can be formed by a contact layer.

Preferably, the semiconductor body has a dislocation gradient in a transverse direction. That is to say that the dislocation density of the semiconductor body is inhomogeneous and the statistical distribution of the dislocations varies in a transverse direction. Such a dislocation gradient can occur particularly when using a growth substrate for the semiconductor layers of the semiconductor body which itself has an inhomogeneous dislocation density.

The longitudinal axis of the ridge-shaped region is furthermore preferably arranged on the side of the central axis in which the dislocation density is lower. What can thus be achieved is that, during operation of the semiconductor body, the radiation is generated relative to the transverse direction of the semiconductor body predominantly in the region in which the dislocation density is low and, consequently, the crystal quality of the active region is high. Investigations on lasers which emit radiation in the blue spectral range have shown that the lifetime of the lasers is all the higher, the lower the dislocation density. The described arrangement of the ridge-shaped region relative to the dislocation density distribution can, therefore, increase the lifetime of the semiconductor laser.

Preferably, the longitudinal axis of the ridge-shaped region is arranged in a manner offset with respect to the central axis of the semiconductor body by at least 10 µm, preferably by at least 20 µm, for example, by 30 µm or more. The higher the offset between central axis and longitudinal axis, the more space is available on a side of the ridge-shaped region on the semiconductor body.

The longitudinal axis of the ridge-shaped region is furthermore preferably arranged in a manner offset with respect to the central axis of the semiconductor body by at least 0.05 times, preferably by at least 0.1 times, an extent of the semiconductor body in the transverse direction.

Further preferably, a contact layer is arranged on the semiconductor body. The contact layer is provided, in particular, for the external electrical contact-connection of the active region from a side facing a top side of the ridge-shaped region. The contact layer can furthermore also be embodied in multilayered fashion.

The contact layer preferably forms a contact area laterally with respect to the ridge-shaped region. The extent of the contact area in a transverse direction is preferably at least 0.3 times, particularly preferably at least 0.4 times, the extent of the semiconductor body at least in regions. Consequently, a comparatively large contact area is available on a side of the ridge-shaped region, which contact area can be externally electrically contact-connected, for example, with a wire bonding connection.

Given a width, that is to say an extent in a transverse direction, of the semiconductor body of approximately 250 µm, what can thus be achieved, for example, is that the contact area has a width of 80 µm or more, preferably 100 µm or more, such that a wire bonding connection, for example, having a diameter of the bonding ball of 50 µm to 80 µm, can be formed in a simplified manner with a sufficiently large distance with respect to the ridge-shaped region. The risk of damage to the ridge-shaped region during production of the wire bonding connection and the requirements made of the accuracy of the wire bonding method are thereby reduced.

In other words, the offset of the longitudinal axis of the ridge-shaped region has the effect that a contact area widened in a transverse direction is available on a side of the ridge-shaped region, without the extent of the semiconductor body having to be increased for this purpose. The occupancy of the growth substrate by an individual semiconductor body can therefore be kept small such that an increased number of semiconductor bodies can be formed on a growth substrate, it nevertheless being ensured that the semiconductor bodies have a high crystal quality and at the same time can be externally electrically contact-connected well.

The semiconductor body, in particular the active region, is preferably based on a nitride compound semiconductor material.

"Based on nitride compound semiconductors" means that the active epitaxial layer sequence or at least one layer thereof comprises a nitride III/V compound semiconductor material, preferably $Al_xIn_yGa_{1-x-y}N$, where $0 \leq x \leq 1$, $0 \leq y \leq 1$ and $x+y \leq 1$. In this case, the material need not necessarily have a mathematically exact composition according to the above formula. Rather, it can comprise one or more dopants and additional constituents which substantially do not change the characteristic physical properties of the $Al_xIn_yGa_{1-x-y}N$ material. For the sake of simplicity, however, the above formula only includes the essential constituents of the crystal lattice (Al, Ga, In, N), even if these can be replaced in part by small amounts of further substances.

Semiconductor lasers based on nitride compound semiconductors can generate radiation from the ultraviolet through the blue to the green spectral range. It goes without saying, however, that it is also possible to use a different semiconductor material, in particular a different compound semiconductor material, for example, $Al_xIn_yGa_{1-x-y}As$ where $0 \leq x \leq 1$, $0 \leq y \leq 1$ and $x+y \leq 1$, to generate radiation in the red or infrared spectral range.

We also provide a method for producing a plurality of semiconductor bodies, a carrier having a multiplicity of component regions separated from one another by separating lines. A semiconductor layer sequence having an active region provided to generate radiation is deposited, preferably epitaxially, for instance by MBE or MOCVD, on the carrier, for example, a growth substrate. A plurality of ridge-shaped regions are formed from the semiconductor layer sequence such that a first ridge-shaped region and a second ridge-shaped region are formed alongside one another between two adjacent separating lines in a direction running perpendicular to the separating lines. At least one of the ridge-shaped regions is arranged closer to a central line running between the adjacent separating lines than to the separating line situated closest to the ridge-shaped region. The semiconductor layer sequence is singulated into a plurality of semiconductor bodies each having at least one ridge-shaped region.

The separating lines preferably run along regions of the carrier in which the dislocation density is increased compared with regions running between the separating lines. Accordingly, the central lines run centrally, that is to say equidistantly, between the separating lines in a region in which the dislocation density is low and, consequently, the crystal quality is high.

The carrier can, therefore, be structured such that the dislocation density increases in a transverse direction from the central line toward the separating lines. Proceeding from the central line, therefore, the dislocation density can increase toward both separating lines. In other words, the dislocation density in the region of the separating lines is higher than the dislocation density in the region of the central lines.

Further preferably, the carrier is based on gallium nitride (GaN). Gallium nitride substrates which have strip-shaped regions having a high dislocation density (that is to say regions running along the separating lines) and regions having a low dislocation density running therebetween (that is to say regions running along the central line) are described, for example, in U.S. Pat. No. 6,812,496 B2, the subject matter of which is incorporated herein by reference.

The singulation is preferably effected along the separating lines and along the central lines, that is to say also between the first ridge-shaped region and the second ridge-shaped region.

With the arrangement of two ridge-shaped regions between two adjacent separating lines, what can be achieved is that a particularly high number of semiconductor components, in particular semiconductor lasers, can be formed on a substrate for the same substrate size. The production costs can thereby be reduced in comparison with an arrangement in which, in a transverse direction, only one semiconductor body emerges from a region between two adjacent separating lines during production.

Furthermore, the arrangement of at least one ridge-shaped region toward the central line ensures that the ridge-shaped region is formed in a region having a high crystal quality on the substrate.

Preferably, both ridge-shaped regions are arranged closer to the central line than to the separating line respectively situated closest. The closer the first ridge-shaped region and the second ridge-shaped region are arranged to the central line, the higher the crystal quality can be in the region of the ridge-shaped region.

In particular, the semiconductor body having the first ridge-shaped region and the semiconductor body having the second ridge-shaped region can be formed symmetrically with respect to one another with regard to their basic form.

In one configuration, the central line forms an axis of symmetry such that the semiconductor bodies, that is to say the semiconductor body having the first ridge-shaped region and the semiconductor body having the second ridge-shaped region, are axially symmetrical with respect to one another.

Alternatively, the semiconductor bodies may be arranged centrosymmetrically with respect to one another, wherein a point of symmetry preferably lies on the central line.

In the case of a substrate in which the dislocation density increases proceeding from the central line in the direction of the separating lines, both ridge-shaped regions can each be formed in the region having a low dislocation density.

Preferably, the first ridge-shaped region and/or the second ridge-shaped region are/is arranged at least 10 µm, preferably at least 20 µm, closer to the central line than to the separating line situated closest.

Preferably, a contact layer is formed on the semiconductor layer sequence such that a contact area provided for external electrical contact-connection is assigned to the ridge-shaped regions in each case on the side facing away from the central line.

The method described has the consequence that two types of semiconductor bodies, namely semiconductor bodies having the first ridge-shaped region and semiconductor bodies having the second ridge-shaped region, are formed simultaneously on the substrate. This is at odds with the conventional procedure in semiconductor technology of providing on a carrier, in particular a growth substrate, in each case a periodic pattern in which exclusively components of the same type are formed in a matrix-like arrangement such that, after singulation, all components emerging there have the same structure.

It has been found however, that the production method can be improved despite the inherently undesired formation of at least two different types of semiconductor bodies with respectively asymmetrical arrangement of the ridge-shaped region with respect to the central axis of the semiconductor body since, in this way, semiconductor bodies having a high crystal quality and a high lifetime resulting therefrom can be produced more cost-effectively overall and, moreover, can be externally electrically contact-connected in a particularly simple manner. Furthermore, the individual semiconductor bodies have a comparatively low variation with regard to the lifetime and the emission power during operation since the ridge-shaped regions are formed in each case in regions of the semiconductor material having a comparable dislocation density.

Preferably, the contact layer is formed such that the semiconductor body having the first ridge-shaped region is optically distinguishable from the semiconductor body having the second ridge-shaped region. In this way, it is ensured that the different semiconductor bodies can be fed to the subsequent production steps reliably and unambiguously assignably.

Preferably, the semiconductor bodies are distinguished from one another by an automatic optical recognition such that the production method can be effected with a high degree of automation in the subsequent steps despite the two types of semiconductor bodies.

Further preferably, an extent of the contact area is at least 20% of the distance between two separating lines. What can be achieved in this way is that the semiconductor bodies produced can be externally electrically contact-connected in a simple manner. At the same time, the contact areas, on account of the asymmetrical arrangement of the ridge-shaped regions, cover only regions of the substrate in which the dislocation density is comparatively high.

The method described is suitable, in particular, for producing a semiconductor laser described further above such that features described in connection with the method can also be used for the semiconductor laser, and vice versa.

Further lasers and methods will become apparent from the following description of the examples in conjunction with the figures.

Elements that are identical, of identical type or act identically are provided with identical reference symbols in the figures.

The figures are in each case schematic illustrations and therefore not necessarily true to scale. Rather, comparatively small elements and, in particular, layer thicknesses may be illustrated with an exaggerated size for the purpose of elucidation.

Figure 1B:
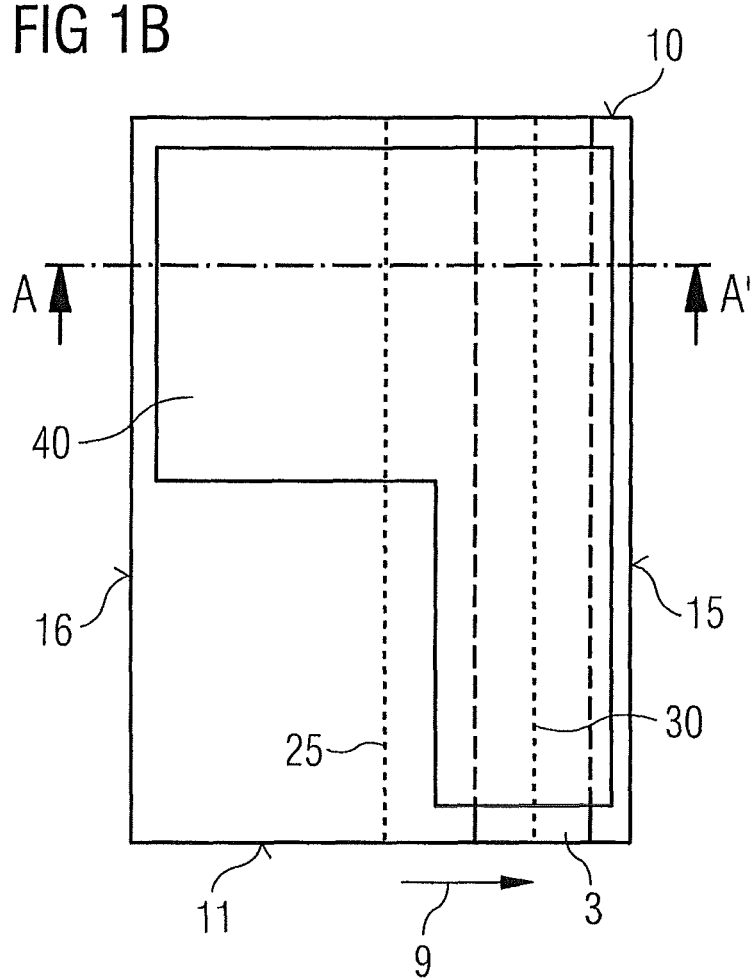

An example of a semiconductor laser is illustrated in schematic plan view in FIG. 1B and in associated sectional view along the line AA' in FIG. 1A, wherein the semiconductor laser is an edge emitting laser with ridge waveguide geometry (ridge waveguide laser).

The semiconductor laser 1 comprises a semiconductor body 2. The semiconductor body 2 comprises a semiconductor layer sequence having an active region 20 provided to generate radiation, a first semiconductor layer 21 and a second semiconductor layer 22. The semiconductor layer sequence forms the semiconductor body. The semiconductor body 2 is arranged on a carrier 5. The carrier 5 can be, for example, a growth substrate for the semiconductor layer sequence of the semiconductor body 2.

A suitable growth substrate is, by way of example, a growth substrate based on gallium nitride, in particular a substrate in which regions having a particularly low dislocation density are arranged between regions embodied in strip-shaped fashion and having a higher dislocation density.

In a departure therefrom, however, the carrier 5 can also be different from the growth substrate. In that case, the carrier does not have to fulfill the stringent requirements made of the crystalline quality of a growth substrate, but rather can be chosen with regard to other properties such as, for example, thermal conductivity, thermal expansion or cost-effective availability.

In this case, the carrier 5 can mechanically stabilize the semiconductor body 2, such that the growth substrate is no longer required and can therefore be removed.

The first semiconductor layer 21 and the second semiconductor layer 22 expediently have conduction types that differ from one another. By way of example, the first semiconductor layer can be p-conducting and the second semiconductor layer n-conducting, or vice versa. The first semiconductor layer and the second semiconductor layer are preferably multilayered. In particular, the first semiconductor layer and the second semiconductor layer can each have a waveguide layer on the side facing the active region 20 and a cladding layer on that side of the waveguide layer which faces away from the active region. In this case, the cladding layers expediently have a lower refractive index than the waveguide layers such that the radiation generated in the active region 20 is guided within the waveguide layers. The cladding layers and the waveguide layers are not explicitly shown in the figures, merely for the sake of simplified illustration.

The semiconductor body 2 has a first side area 15 and a second side area 16, which delimit the semiconductor body in a transverse direction. A central axis 25 of the semiconductor body runs centrally between these side areas.

In a longitudinal direction, the semiconductor body 2 has a radiation passage area 10 and a rear side 11 lying opposite the radiation passage area. The radiation passage area and the rear side form a resonator such that coherent radiation can be generated in the active region 20 during operation, wherein the emission direction runs perpendicular or substantially perpendicular to the radiation passage area. To influence reflectivity, the radiation passage area and the rear side can be provided with a coating (not explicitly illustrated in the figures). Preferably, the reflectivity is higher at the rear side than at the radiation passage area.

Furthermore, the semiconductor body 2 has a ridge-shaped region 3 having a longitudinal axis 30 running in the emission direction, wherein a ridge waveguide is formed by the ridge-shaped region, the waveguide being provided for guiding the coherent radiation generated in the active region in a transverse direction. The longitudinal axis is arranged in a manner offset with respect to the central axis 25 of the semiconductor body 2 such that the central axis is arranged closer to the first side area 15 than to the second side area 16.

An arrow 9 illustrates the course of a dislocation density gradient, wherein the dislocation density decreases in the direction of the arrow. This means that the ridge-shaped region 3 is formed in the region of the semiconductor body 2 in which the dislocation density is lowest. Consequently, the crystal quality of the semiconductor body is highest in the region which is crucial for generating radiation during the operation of the semiconductor laser.

The longitudinal axis of the ridge-shaped region is arranged in a manner offset with respect to the central axis of the semiconductor body 2 preferably by at least 10 μm, particularly preferably by at least 20 μm, for example, by 30 μm or more.

It is ensured in this way that the ridge-shaped region 3 has a comparatively high crystal quality.

A contact layer 4 is formed on the semiconductor body 2. The contact layer 4 serves for the external electrical contact-connection of the active region 2 from a top side 35 of the ridge-shaped region 3, for example, by a wire bonding connection.

A further contact layer 45 is formed on that side of the carrier 5 which faces away from the semiconductor body 2. The further contact layer is electrically conductively connected to the second semiconductor layer 22 via the carrier 5.

With the contact layer 4 and the further contact layer 45, during the operation of the semiconductor laser 1, charge carriers can be injected from different sides into the active region 20 and recombine there with the emission of radiation.

Furthermore, an insulation layer 6 is arranged in regions between the contact layer 4 and the semiconductor body 2. The insulation layer prevents an electrical short circuit of the active region. On the top side 35 of the ridge-shaped region 3, the insulation layer 6 has a cutout 65, in which the contact layer 4 adjoins the first semiconductor layer 21 and produces an electrically conductive connection to the semiconductor body from the top side 35 of the ridge-shaped region.

Laterally with respect to the ridge-shaped region 3, the contact layer 4 forms a contact area 40, provided for external contact-connection by a bonding wire.

The contact layer 4 and/or the further contact layer 45 preferably contain(s) a metal, for example, gold, nickel, titanium, platinum, rhodium, palladium, silver, aluminum or chromium, or a metallic alloy comprising at least one of the metals mentioned. The contact layers can also be multilayered.

The active region is based on a nitride compound semiconductor material and provided to generate in the ultraviolet, blue or green spectral range. It goes without saying that a different semiconductor material, in particular a III/V compound semiconductor material, for instance InGaAlAs or InGaAlP, can also be used.

The extent of the contact area 40 in a transverse direction is preferably at least 0.3 times, particularly preferably at least 0.4 times, the extent of the semiconductor body 2. It is ensured in this way that the semiconductor body can be electrically contact-connected in a simple manner from the side facing away from the carrier 5.

By way of example, the extent of the contact area in a transverse direction given a width of the semiconductor body 2 of 200 μm can have approximately a width of 80 μm or more, for example, 105 μm. This ensures that the semiconductor body can be electrically contact-connected in a simple and reliable manner by a wire bonding method. In contrast thereto, in the case of a symmetrical arrangement of the ridge-shaped region, given a width of the semiconductor body of only 200 μm, there would be the risk of the wire bonding connection arising too close to the ridge-shaped region and the ridge-shaped region being damaged or even destroyed during the production of the wire bonding connection.

Figure 2A:
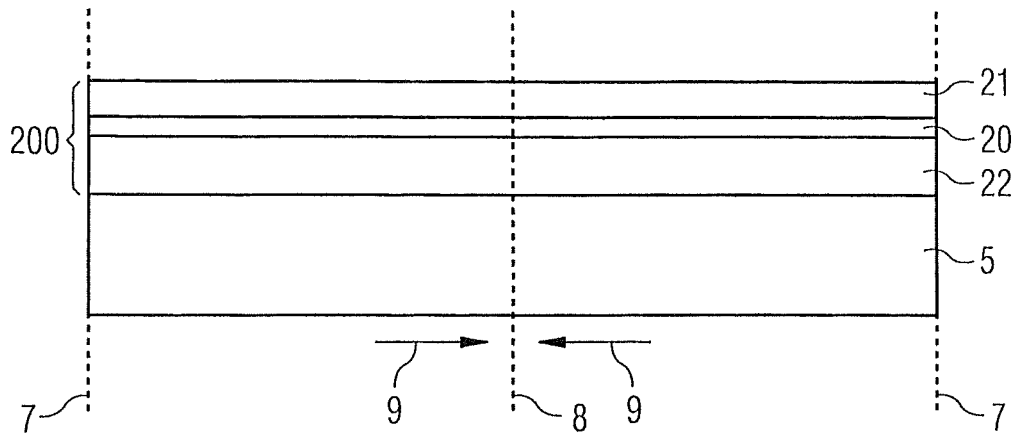
FIGS. 2A to 2D show an example of a production method on the basis of intermediate steps illustrated schematically in sectional view (FIGS. 2A to 2C) and a plan view in FIG. 2D.
Figure 2B:
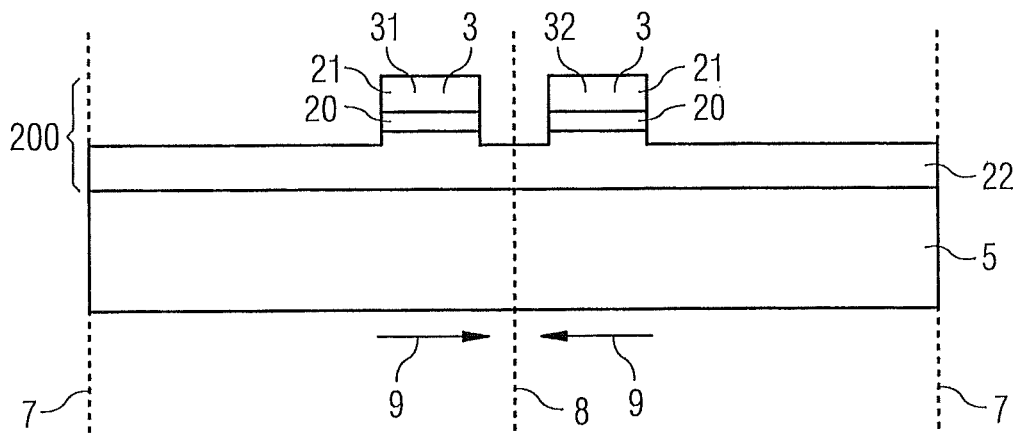
Figure 2C:
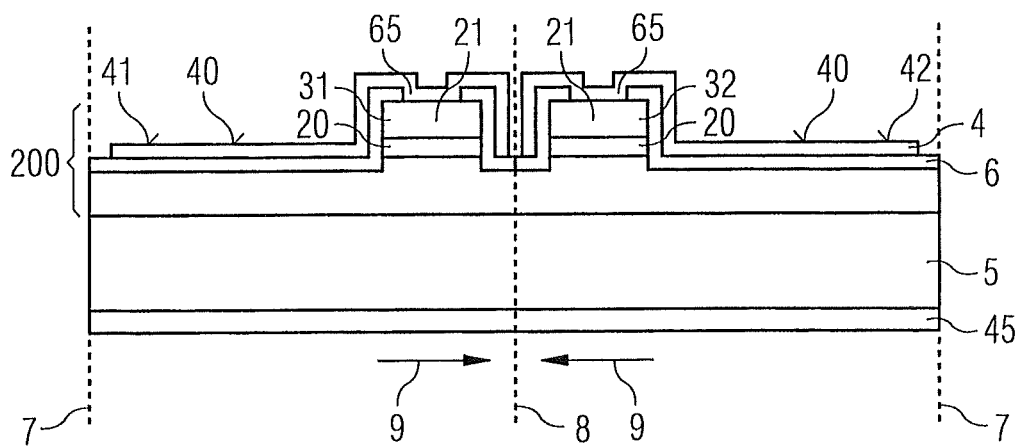
Figure 2D:
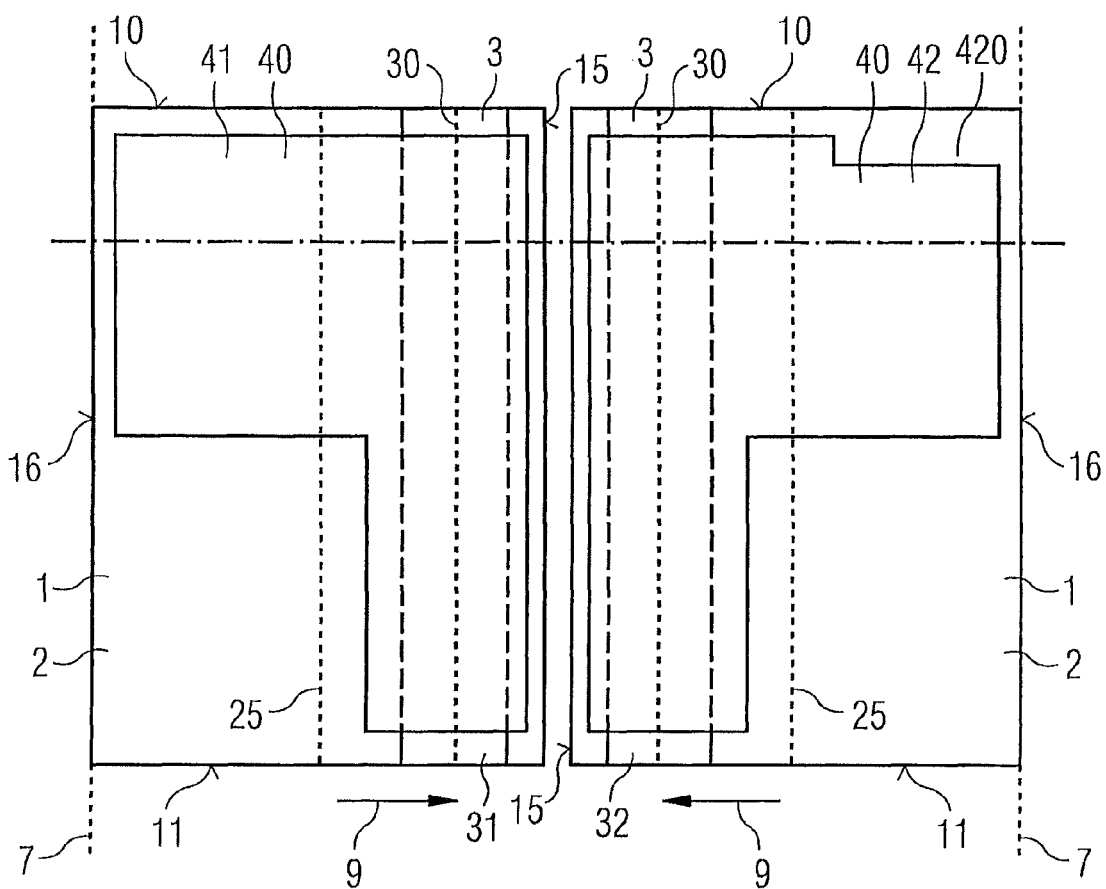

An example of a production method is shown on the basis of intermediate steps illustrated in schematic sectional view in FIGS. 2A and 2C and a plan view in FIG. 2D.

As illustrated in FIG. 2A, a substrate having a strip-shaped patterning is provided as a carrier 5. A distance between two adjacent separating lines 7 running parallel to one another can be 100 μm to 600 μm, preferably 200 μm to 500 μm, for example, 400 μm.

For simplified illustration, the figures show in each case only one region of the carrier 5 running between two adjacent separating lines 7. On the surface of the carrier 5, the separating lines 7 form a strip-shaped pattern, wherein the defect density is higher along the separating lines than between the separating lines. The figures furthermore show, for the purpose of elucidation, a central line 8 running at half the distance between the separating lines 7 parallel to the latter.

The arrows 9 illustrate the gradient of the dislocation density, which increases from the central line 8 toward the separating lines 7 such that the crystal quality of the carrier is in each case highest in the region around the central lines.

On the carrier 5, a semiconductor layer sequence 200 having an active region 20, a first semiconductor layer 21 and a second semiconductor layer 22 is deposited epitaxially, for example, by MBE or MOCVD.

The semiconductor layer sequence 200 is patterned such that ridge-shaped regions 3 are formed which, in a plan view of the carrier, have a longitudinal axis 30 running parallel to the separating lines 7 (FIG. 2B).

The patterning can be effected, for example, by wet-chemical or dry-chemical etching.

The patterning is effected in this case such that a first ridge-shaped region 31 and a second ridge-shaped region 32 are formed alongside one another in a transverse direction between two adjacent separating lines 7. The ridge-shaped regions 31, 32 are in each case arranged closer to the central line 8 than to the separating line 7 respectively situated closest. What can thus be achieved is that both ridge-shaped regions are arranged close to the central line and, consequently, can have a high crystalline quality.

Furthermore, the semiconductor body 2 having the first ridge-shaped region 31 and the semiconductor body having the second ridge-shaped region 32 are axially symmetrical with respect to the central line.

During later singulation along the separating lines 7 and the central line 8, therefore, two different types of semiconductor bodies emerge from the wafer assemblage, wherein, as seen in the emission direction, in the case of the semiconductor body having the first ridge-shaped region 31, the ridge-shaped region is offset toward the right relative to the central axis 25 and the second ridge-shaped region 32 is offset toward the left relative to the central axis 25 (FIG. 2D).

By contrast, in a conventional arrangement of the ridge-shaped regions centrally with respect to the semiconductor bodies, that is to say without an offset between the central axis of the semiconductor body and the longitudinal axis of the ridge-shaped region, the ridge-shaped regions would run closer to the separating lines and therefore have a reduced crystal quality.

As illustrated in FIG. 2C, an insulation layer 6 is formed on the patterned semiconductor layer sequence 200. The insulation layer has cutouts 65 in each case on a top side of the ridge-shaped regions 31, 32. The insulation layer is provided, in particular, to protect the active region 20 against an electrical short circuit.

By way of example, a nitride, for instance silicon nitride, or an oxide, for instance titanium oxide or silicon oxide, or an oxynitride, for instance silicon oxynitride, is suitable as material for the insulation layer.

A contact layer 4 is subsequently deposited on the semiconductor layer sequence 200, which contact layer forms through the cutouts 65 an electrical contact with the first semiconductor layer 21 in the region of the ridge-shaped regions 31, 32.

Laterally with respect to the first ridge-shaped region 31 and the second ridge-shaped region 32, this gives rise to a first contact area 41 and a second contact area 42, respectively, provided for the external electrical contact-connection of the semiconductor laser.

An extent of the contact areas in a transverse direction is preferably at least 20% of the distance between two adjacent separating lines.

Furthermore, a further contact layer 45 is deposited on that side of the carrier 5 which faces away from the semiconductor layer sequence 200. The further contact layer serves as an external electrical contact-connection on the underside.

The deposition of the contact layer 4 and/or of the further contact layer 45 can be effected by sputtering or vapor deposition, for example. Furthermore, the contact layer and/or the further contact layer can also be multilayered.

After singulation perpendicular to the separating lines 7, the radiation passage area 10 and the rear side 11 can be coated. This can be carried out, in particular, before the semiconductor bodies are singulated along the separating lines 7 and along the central lines 8.

The carrier is divided along the separating lines 7 and the central lines 8 to complete the semiconductor laser. After the conclusion of singulation, the first side areas 15 of the semiconductor bodies 2 in each case run along the central line 8 and the second side areas 16 in each case run along the separating lines 7.

This division can be effected, in particular, mechanically, for example, by splitting, breaking, scribing or sawing, chemically, for example, by wet-chemical or dry-chemical etching, and/or by coherent radiation, for instance laser radiation.

As illustrated in FIG. 2D, the semiconductor body having the first ridge-shaped region 31 and the semiconductor body having the second ridge-shaped region 32 also differ with regard to their basic form, besides the offset arrangement of the ridge-shaped regions, in that the contact areas 41 and 42, respectively, as seen in the direction of the radiation passage area 10, are arranged on different sides of the ridge-shaped region.

Furthermore, the contact area 42 has a marking 420, on the basis of which the semiconductor bodies 2, after singulation, can be distinguished from one another in a simplified manner, for example, by an automatic optical recognition. This may ensure that the semiconductor bodies can be fed to subsequent production steps reliably and in an automatable fashion. A distinction on the basis of the contact layer is particularly favorable since the latter, owing to its typically metallic surface, affords a high contrast with the rest of the surface of the semiconductor laser.

In this example, the marking is merely by way of example a region in which the size of the second contact area 42 is reduced relative to the size of the first contact area 41.

In a departure therefrom, a different type of marking can also be formed, wherein the markings can also be formed as separate regions on the semiconductor body, which need not necessarily also serve for the electrical contact-connection of the semiconductor body 2.

By way of example, the marking 420 can also be in the form of characters, for instance numbers and/or letters, on the semiconductor body 2 which are spaced apart from the contact areas 40.

In the example described, merely by way of example, a ridge-shaped region 3 was shown in which the active region 20 is formed in the ridge-shaped region. In a departure therefrom, the ridge-shaped region 3 can also be formed such that the active region 20 is not severed during patterning such that only the first semiconductor layer 21 forms the ridge-shaped region. In this case, the insulation layer 6 can also be dispensed with. Furthermore, it is also conceivable to form the ridge-shaped region outside the semiconductor body, for example, in the form of a strip-shaped region of the contact layer 4.

Furthermore, in a departure from the examples described, the semiconductor bodies 2 having the first ridge-shaped region 31 and the semiconductor bodies having the second ridge-shaped region 32 can also be centrosymmetrical with respect to one another, in particular with a point of symmetry on the central line 8. What can thereby be achieved is that semiconductor lasers of identical type emerge when the carrier is singulated.

In this case, the radiation passage area of the semiconductor body having the first ridge-shaped region 31 and the radiation passage area of the semiconductor body having the second ridge-shaped region 32 are situated on different sides prior to the singulation along the central line 8. Therefore, the radiation passage area 10 and the rear side 11 are preferably coated after the semiconductor bodies have been singulated such that the rear sides can in each case have a higher reflectivity than the radiation passage areas.

Our lasers and methods are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. A method of producing a plurality of semiconductor bodies comprising:
   a) providing a carrier having a multiplicity of component regions separated from one another by separating lines;
   b) depositing a semiconductor layer sequence having an active region that generates radiation;
   c) forming a plurality of ridge-shaped regions from the semiconductor layer sequence such that a first ridge-shaped region and a second ridge-shaped region are formed alongside one another between two adjacent separating lines in a direction running perpendicular to the separating lines, wherein at least one of the ridge-shaped regions is arranged closer to a central line running between the adjacent separating lines than to the separating line situated closest to said ridge-shaped region;
   d) forming a contact layer for external electrical contacting of the active region on the semiconductor layer sequence, wherein a marking is formed by the contact layer on the basis or which the semiconductor body having the first ridge-shaped region and the semiconductor body having, the second ridge-shaped region are optically distinguishable from one another; and
   (e) singulating the semiconductor layer sequence into a plurality of semiconductor bodies each having at least one ridge-shaped region.

2. The method according to claim 1, wherein both ridge-shaped regions are arranged closer to the central line than to the separating line respectively situated closest.

3. The method according to claim 1, wherein a dislocation density of the carrier increases proceeding from the central line in the direction of the separating lines and singulation is effected along the separating lines and along the central line.

4. The method according to claim 1, wherein the contact layer on the semiconductor layer sequence is formed such that a contact area provided for external electrical contact-connection is assigned to the ridge-shaped regions in each case on the side facing away from the central line.

5. The method according to claim 1, wherein the semiconductor body having the first ridge-shaped region and the semiconductor body having the second ridge-shaped region are distinguished from one another by an automatic optical recognition.

6. The method according to claim 4, wherein an extent of the contact area is at least 20% of the distance between two separating lines.

7. The method according to claim 1, wherein the carrier is based on GaN.

8. The semiconductor laser according to claim 1, having a first side area and a second side area, said first side area and said second side area delimiting the semiconductor body in the transverse direction, wherein a dislocation density increases from the first side area to the second side area.

9. A method of producing a plurality of semiconductor bodies comprising:
   a) providing a carrier having a multiplicity of component regions separated from one another by separating lines, wherein the separating lines run along regions of the carrier in which the dislocation density is increased compared with regions running between the separating lines;
   b) depositing a semiconductor layer sequence having an active region that generates radiation;
   c) forming a plurality of ridge-shaped regions from the semiconductor layer sequence such that a first ridge-shaped region and a second ridge-shaped region are formed alongside one another between two adjacent separating lines in a direction running perpendicular to the separating lines, wherein at least one of the ridge-shaped regions is arranged closer to a central line running between the adjacent separating lines than to the separating line situated closest to said ridge-shaped region, wherein a first semiconductor body with the first ridge-shaped region and a second semiconductor body with the second ridge-shaped region are arranged centrosymmetrically with respect to one another;
   d) singulating the semiconductor layer sequence along the separating liens and along the central line into a plurality of semiconductor bodies each having at least one ridge-shaped region; and
   e) forming a coating of a radiation passage area and a rear side arranged opposite the radiation passage area subsequent to singulation of the semiconductor bodies along a central line running between the first semiconductor body and the second semiconductor body.

10. The method according to claim 9, wherein both ridge-shaped regions are arranged closer to the central line than to the separating line respectively situated closest.

11. The method according to claim 9, wherein a point of symmetry is arranged on the central line.

* * * * *

UNITED STATES PATENT AND TRADEMARK OFFICE
CERTIFICATE OF CORRECTION

| | |
|---|---|
| PATENT NO. | : 8,879,596 B2 |
| APPLICATION NO. | : 13/515024 |
| DATED | : November 4, 2014 |
| INVENTOR(S) | : Dini et al. |

It is certified that error appears in the above-identified patent and that said Letters Patent is hereby corrected as shown below:

In the Claims,

In Column 11

At line 35, please change "basis or" to --basis of--; and at line 37, please delete the "," after "having".

In Column 12

At line 40, please change "liens" to --lines--.

Signed and Sealed this
Seventeenth Day of March, 2015

Michelle K. Lee
*Director of the United States Patent and Trademark Office*